United States Patent [19]

Rossi et al.

[11] Patent Number: 4,980,576
[45] Date of Patent: Dec. 25, 1990

[54] INDUCTANCE AND CAPACITANCE CHARGE PUMP CIRCUIT FOR DRIVING POWER MOS TRANSISTOR BRIDGES

[75] Inventors: Domenico Rossi, Cilavegna; Claudio Diazzi, Milan, both of Italy

[73] Assignee: SGS-Thomson Microelectronics s.r.l., Milan, Italy

[21] Appl. No.: 364,172

[22] Filed: Jun. 12, 1989

[30] Foreign Application Priority Data

Jul. 22, 1988 [IT] Italy ................. 21450 A/88

[51] Int. Cl.$^5$ ................. H03K 3/01; H03K 17/56
[52] U.S. Cl. ................. 307/270; 307/246; 307/264
[58] Field of Search ........... 307/270, 246, 570, 257, 307/264, 300, 578, 482, 354, 362

[56] References Cited

U.S. PATENT DOCUMENTS

| 4,097,773 | 6/1978 | Lindmark | 307/246 |
| 4,312,029 | 1/1982 | Zellmer | 307/300 |
| 4,348,598 | 9/1982 | Smith | 307/300 |
| 4,751,403 | 6/1988 | Mackawa et al. | 307/270 |
| 4,837,457 | 6/1989 | Bergstrom et al. | 307/270 |

Primary Examiner—Timothy P. Callahan
Attorney, Agent, or Firm—Sixbey, Friedman, Leedom & Ferguson

[57] ABSTRACT

The circuit comprises a tank capacitance and a charge circuit supplied with the same voltage as the bridge and comprising an inductance and a control transistor. There is also provided a control circuit, which comprises an oscillator controlling the periodic switching of control transistor and a comparator which controls the momentary clamping of control transistor in the condition wherein the charge circuit is interrupted when the difference between the voltage across capacitance and the power supply voltage exceeds a preset maximum value and the unclamping of the same transistor when such difference falls below a preset minimum value. A further comparator similarly clamps control transistor if there is an excess current in the transistor itself.

5 Claims, 3 Drawing Sheets

INDUCTANCE AND CAPACITANCE CHARGE PUMP CIRCUIT FOR DRIVING POWER MOS TRANSISTOR BRIDGES

The present invention relates to an inductance and capacitance charge pump circuit for driving power MOS transistor bridges.

As is well known a bridge circuit consists of two half-bridges with two transistors in series called higher or high side and lower or low side respectively according to whether they are on the side of the power supply or on that of earth. The driving stages associated with the two transistors are called in a similar manner.

When the transistors used are of the power MOS type, in particular N-channel DMOS, their drive must be able to produce a gate source voltage of 10V, so as to ensure least resistance when the transistors operate in the triode zone. This means that a voltage of 10V must be applied to the lower transistor gate, while a voltage which must be 10V higher than the bridge power supply voltage must be applied to that of the higher transistor.

If the power supply voltage to the bridge is relatively high (from 10 to 12V), it is obviously easy to obtain the 10V voltage necessary for the lower MOS transistor drive. For the higher transistor drive, however, it is necessary to use a charge pump circuit to raise the voltage up to the required value.

With low power supply voltages (say, 5V) the lower transistor drive also fails. Two charge pump circuits are then required, one with a lower pump capacitance for the lower transistor and another with a higher pump capacitance for the higher transistor.

A charge pump circuit usually comprises one or more pump capacitors according to the required output voltage (for example, in the above case, one for driving the lower transistor, two for driving the higher transistor), a tank capacitor frequently constituted by the equivalent input capacitance of the driven transistor and a fixed frequency oscillator which scans the charge transfer to or from the pump capacitors to the tank capacitor.

The abundant use of capacitors makes current charge pump circuits inapplicable in a completely monolithic form unless components are used which are external to the integrated circuit.

In addition, again due to such capacitors, a certain slowness in reaching the maximum output voltage required must be attributed to them. As an order of magnitude, with an oscillator having a frequency of 500 KHz, between 20 and 100 microseconds are required to reach 10V, corresponding to 10-50 oscillator clock strokes.

This places a further serious limitation on the use for a bridge circuit which, say, is used in a PWM current control ring in an inductive load with typical operating frequencies of 10-50 KHz, because frequencies of this type (corresponding to a period from 100 to 20 microseconds respectively) require much shorter ignition and blanking times.

The reduction of switching times requires the use of Bootstrap capacitative techniques, which frequently burden the driving circuits, do not completely solve the problems of low voltage drives and lastly cannot be accomplished in a monolithic form.

It should lastly be noted that, as already pointed out, in the case of a low voltage power supply, not one but two charge pump circuits are required and this of course cannot but complicate the above problems.

In view of this state of the art, the object of the present invention has been to accomplish a charge pump circuit, which was to be relatively fast, easily accomplished in a monolithic form and above all used as the only circuit both for the lower and for the higher transistor, with low as well as high power supply voltage.

According to the invention such object has been attained with a charge pump circuit, which comprises in a known manner a tank capacitance for storing a charge corresponding to the desired driving voltage and a charge circuit of said capacitance supplied by the bridge power supply voltage and is characterized in that said charge circuit includes an inductance and a control transistor operated to switch periodically from a condition wherein a charge current is delivered from said inductance to said capacitance and a condition wherein said delivery and charge accumulation in said inductance are interrupted, there being provided for said control transistor a control circuit comprising an oscillator having a preset frequency and a comparator suitable for reading the difference between the voltage across said capacitance and the power supply voltage and to control the clamping of the control transistor in said delivery condition when said difference is higher than a preset maximum value and the unclamping of the control transistor and the restart of its periodic switching operations when said difference falls below a preset minimum value.

The circuit according to the invention thus reduces the use of capacitors to tank capacitance only. Charge times are thus substantially shortened, entirely to the advantage of the speed of ignition and blanking of the bridge and of its use in the most diverse applications. In addition a single circuit is able to operate both MOS transistors, either with a low or with a high power supply voltage, placing at their disposal as required the voltage required for their drive.

An embodiment of the present invention is illustrated for greater clarity, but with no limiting intent, in the enclosed drawings, wherein.

Figure 1:
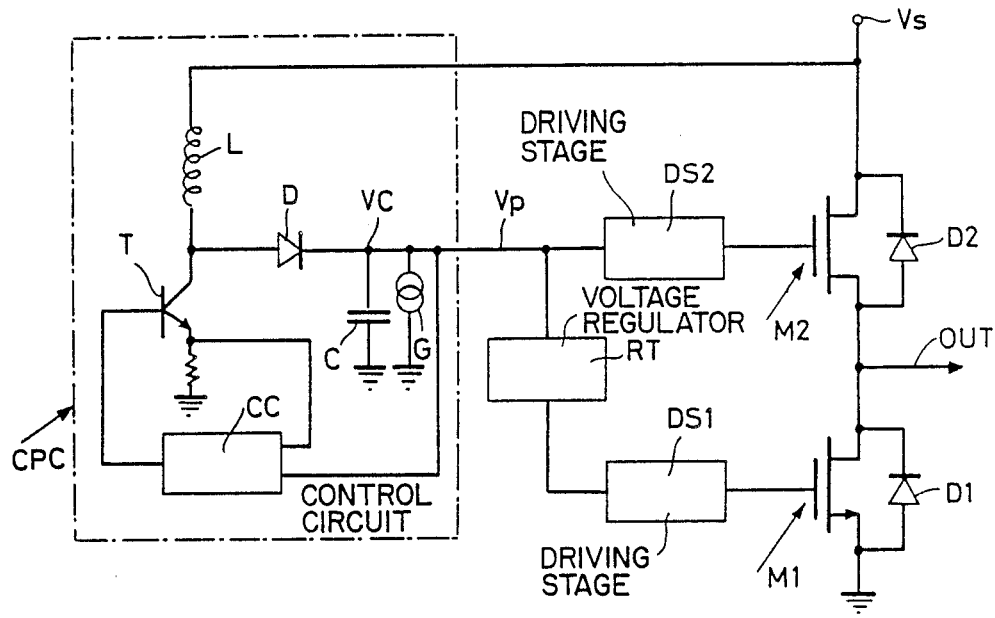
FIG. 1 shows a power MOS transistor half-bridge with driving stages supplied by means of a charge pump circuit according to the present invention.

FIG. 1 shows a half-bridge circuit connected between the Vs voltage supply terminal and earth. The half-bridge comprises two power MOS transistors M1 and M2, low side or lower and high side or higher respectively, both preferably of the N-channel DMOS type. Two diodes D1 and D2 connect in push-pull the source and drain terminals of the two MOS transistors M1 and M2. The output of the half-bridge is indicated with OUT.

The two MOS transistors M1 and M2 are provided with respective driving stages DS1 and DS2, of a type known in itself, whose object it is to apply a voltage to the gate terminals of the respective transistors such as to determine a gate-source voltage Vgs equal to at least 10V.

For this object the two driving stages DS1 and DS2 are supplied by a charge pump circuit CPC, which starting from the same supply voltage Vs of the half-bridge, makes a driving voltage Vp available at its output which is higher than the supply voltage Vs by about 15V. The voltage Vp supplies the higher stage DS2 directly, while a voltage regulator RT set at from 10 to 12V is connected for the lower stage DS1.

The charge pump circuit CPC essentially comprises an inductance L, a bipolar control transistor T of the NPN type, a diode D, a tank capacitance C and a control circuit CC.

Inductance L is connected between the power supply terminal having voltage Vs and the collector of the bipolar transistor T, whose emitter is earthed by means of a resistance R. The collector of transistor T is also earthed by means of the series of diode D and capacitance C, which has a current generator G connected in parallel. The intermediate branch point between diode D and capacitance C constitutes the output UC of the charge pump circuit, where the driving voltage Vp is made available.

Figure 2:
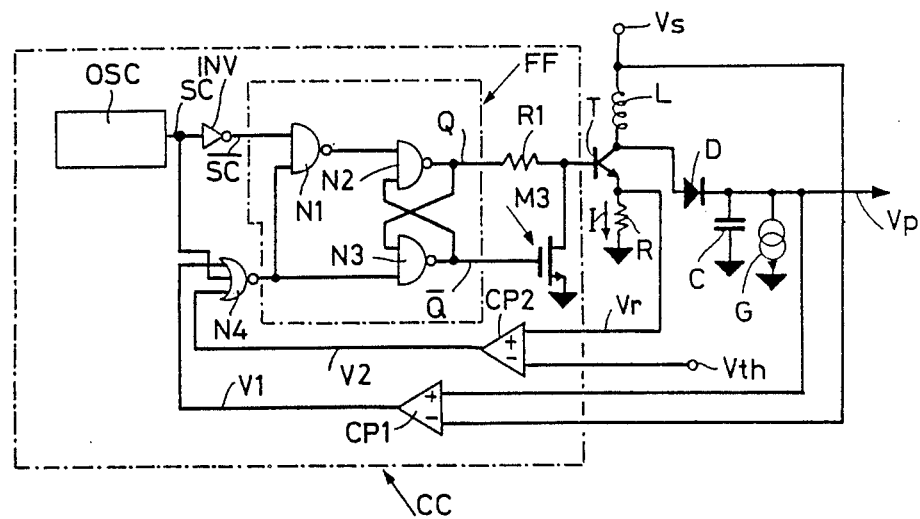
FIG. 2 shows the circuitry details of the charge pump circuit of FIG. 1.

At the base of the bipolar transistor T there is connected the output of control circuit CC, whose details are shown in FIG. 2.

The control circuit CC comprises mainly an oscillator OSC, which continuously delivers clock signals SC at a fixed frequency, an over-voltage comparator CP1 and an over-current comparator CP2.

The comparator CP1 is a hysteresis comparator which has a negative input connected to the power supply terminal at voltage Vs and a positive input connected to the UC output of the charge pump circuit. It therefore compares the two voltages Vp and Vs, giving rise to an output V1 at a logic level "1 " when Vp-Vs exceeds a preset maximum value Vthh, say 15V, and an output at a logic level "0" when Vp-Vs falls below a preset minimum value Vthl, say 14V.

In turn comparator CP2 has a positive input connected to the collector of bipolar transistor T and a negative input connected to a terminal having a threshold reference voltage Vth. It thus compares the voltage Vr at the extremities of resistance R with the above threshold reference voltage Vth, giving rise to an output V2 at a logic level "1" when Vr is greater than Vth, at a logic level "0" in the opposite case.

The outputs of the oscillator OSC and of the comparators CP1 and CP2 are applied to the inputs of the bistable multivibrator FF of the reset dominance type, whose output Q and Q' control the base of bipolar transistor T by means of a resistance R1 and an N-channel DMOS transistor M3. The bistable multivibrator FF comprises three NAND logic gates N1, N2, N3, the first of which has an input connected to the output of oscillator OSC through an inverter INV and another input connected to the output of an NOR logic gate N4, which has three inputs connected to the output of oscillator OSC, to the output of comparator CP1 and to the output of comparator CP2, respectively. The logic gates N2 and N3 in turn have an input connected to the output of logic gates N1 and N4, respectively, and another input connected to logic gates N3 and N2, respectively. The output of gate N2, that is the output Q of the bistable multivibrator FF, is connected to the base of transistor T by means of resistance R1. The output of gate N3, that is the inverted output Q'0 of the bistable multivibrator FF, is in its turn connected to the gate of transistor M3, which has the drain connected to the base of transistor T and the source connected to earth.

The entire circuit described may be integrated in a single monolithic structure, except for inductance L and capacitance C. Naturally an integration technique is necessary to provide for the coexistence of bipolar and MOS transistors.

From the described structure there derives the following operating mode of the charge pump circuit of FIG. 2, assuming it to be used for driving a power MOS transistor half-bridge as illustrated in FIG. 1.

As already said, the oscillator OSC delivers a fixed frequency clock signal SC, which is subsequently transformed into a corresponding inverted clock signal SC' by inverter INV. The waveform of the signal SC' is illustrated in curve (a) of FIGS. 3 and 4, where the X-axis represents time t.

When SC'="0", the output Q of the bistable multivibrator FF is at logic level "1" (curve d) of FIGS. (3 and 4) and the bipolar transistor T is in conduction. Consequently, inductance L and transistor T are passed through by a current I which increases according to the law $I = Vs/1 \times t$.

Figure 3:
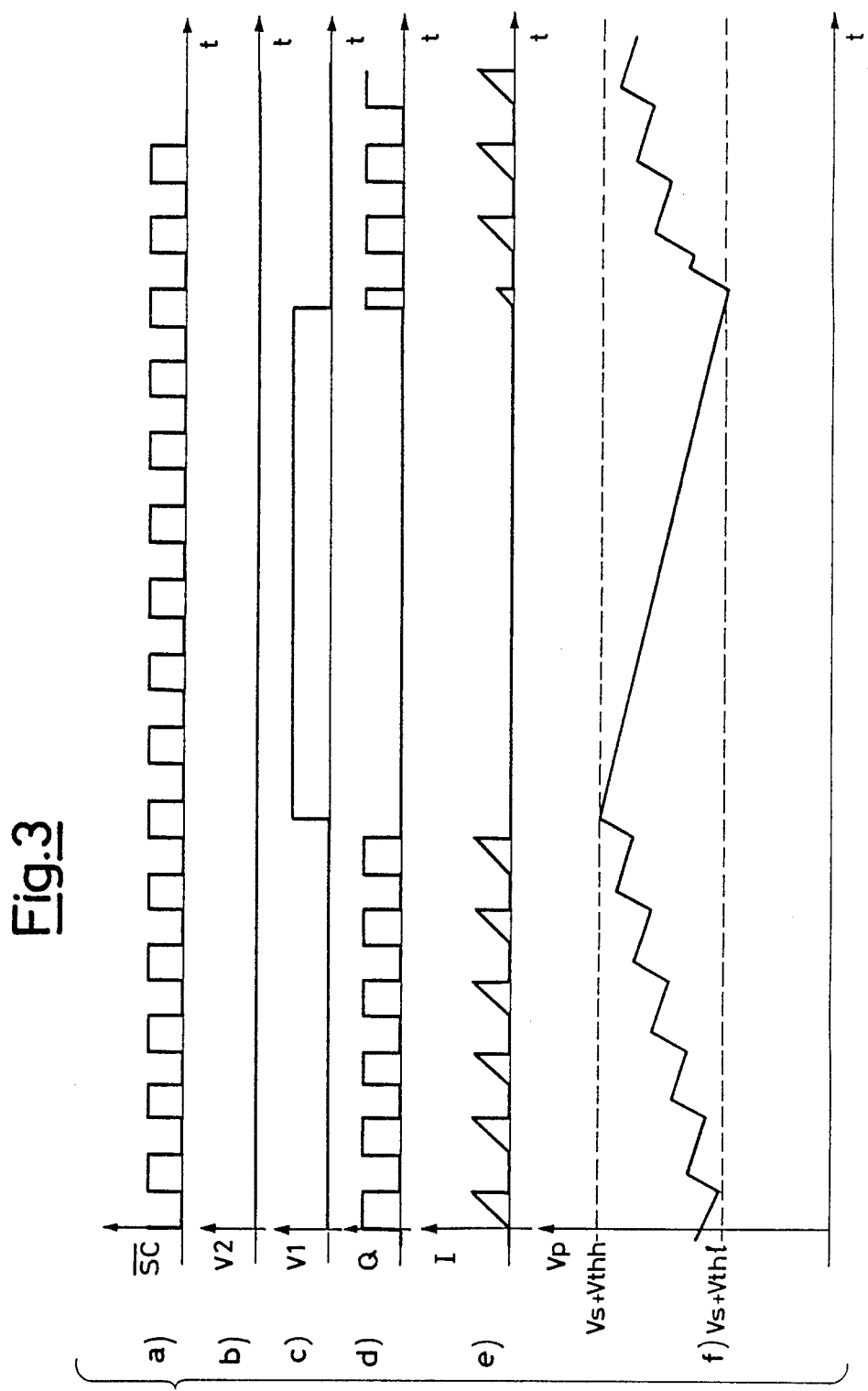
FIGS. 3 and 4 shows the waveforms of the main signals present in the circuit of FIG. 2, in the case of low and high power supply voltage, respectively.
Figure 4:
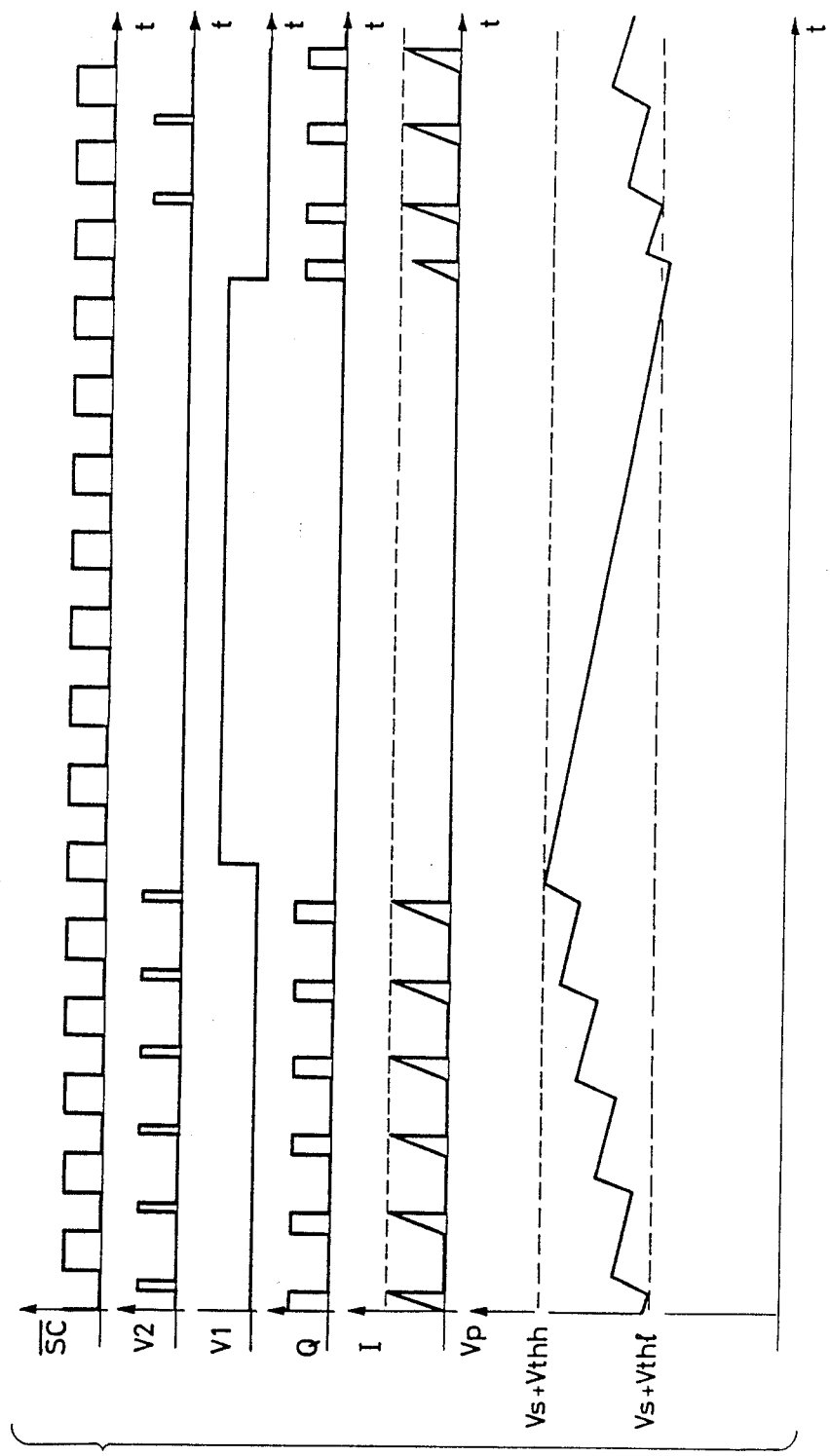

In the case of low power supply voltage $Vs=5V$, the slope of the growth curve of I is that illustrated in curve (e) of FIG. 3 and is insufficient to allow Vr to reach the threshold value Vth of the comparator CP2 before the inverted clock signal SC' switches to logic level "1" and consequently causes the output Q of the bistable multivibrator FF to switch to "0". The output V2 of comparator CP2 thus remains at logic level "0" (curve b) of FIG. (3).

The blanking of transistor T determines the transfer of the energy stored in inductance L to capacitance C with consequent growth of the output voltage Vp.

It is of course necessary for the blanking time of transistor T to be sufficiently long to allow the transfer from L to C of the entire stored charge. Since in the case considered the output voltage of the charge pump circuit CPC must be according to the equation $Vp = Vs + 15\ V$ with $Vs = 5V$, the discharge slope of the current from L to C during the charge transfer is three times greater, so that a transistor T blanking time is required which is greater than or equal to ⅓ of that of conduction. This occurs provided that, as illustrated in FIG. 3, the duty cycle of the SC' signal is less than or equal to 50%.

When SC' then goes back to value "0", transistor T reignites and inductance L charges again, while capacitance C partially discharges on the driving stages DS1 and DS2 (curve f) of FIG. (3).

The cycle described then repeats itself until the output voltage Vp does not reach the upper tripping threshold of comparator CP1, that is Vs+Vthh. Once this threshold is exceeded, the output V1 of the comparator CP1 goes to "1" (curve c) of FIG. (3), thus causing the switching of bistable multivibrator FF to a reset state which makes the system insensitive to the clock signal SC and keeps transistor T blanked out.

Capacitance C then discharges progressively until the lower tripping threshold, Vs+Vthl, of the hysteresis comparator CP1 is reached. The discharge time obviously depends on the characteristics of the driving stages DS1 and DS2.

Once the aforesaid lower tripping threshold has been reached, the output voltage V1 of comparator CP1 returns to "0", the bistable multivibrator FF is released and the clock signal SC returns to controlling an alternation of ignitions and blankings of transistor T and a consequent repetition of periodic energy transfers from inductance L to capacitance C.

The result is that at the output of the charge pump circuit CPC there is made available a voltage Vp variable between Vs+Vthh and Vs+Vthl, in the case considered between Vs+15V and Vs+14V. Such voltage is more than sufficient for driving the lower MOS transistor Ml, for which recourse is made to the voltage regulator RT, and it is also sufficient for driving the higher MOS transistor M2.

If the power supply voltage Vs is higher, say Vs=12V, the behaviour of the charge pump circuit CPC does not change conceptually, but the growth of the current I during the ignition stages of transistor T has a greater slope (curve e) of FIG. (4). The system would thus tend to reach levels of current and energy in inductance L such as not to allow their complete transfer to capacitor C during the subsequent blanking stages of transistor T. There would thus occur an accumulation of current in inductance L and an increase in the current passing through transistor T, such as to cause an undesirable increase in the dissipated power and a reduced efficiency of the charge pump circuit.

To avoid this drawback the comparator CP2 is provided, which limits the current in inductance L to the value corresponding to its tripping threshold Vth. As soon as I reaches this value, the output voltage V2 of comparator CP2 rises to logic level "1" causing a momentary reset of bistable multivibrator FF and the equally momentary blanking of transistor T. Impulses Q are thus shorter and correspondingly shorter are the conduction times of transistor T. Naturally the limiting value of the current must be set so as to ensure the transfer of energy from L to C within the blanking time of transistor T.

In this case again the charge pump circuit CPC makes available at its output a voltage Vp between Vs+Vthh and Vs+Vthl, in the example considered between Vs+15V and Vs+14V.

It thus appears evident that a single charge pump circuit according to the invention, which can be integrated completely except for inductance L and capacitance C, ensures the required driving voltage both for the lower MOS and for the higher MOS, both with a high and with a low supply voltage Vs. The reduced capacitance used, on the other hand, reduces tripping times, allowing the use of the charge pump circuit and of the half-bridge with which it is associated also for applications which require short ignition and blanking times of the power transistors. To this end it is particularly important that the accomplishment of transistor T be in the form of a bipolar transistor, which must have a lower tripping threshold than that of an MOS transistor so as to be able to switch at a supply voltage lower than that of conduction of the MOS transistor.

What is claimed is:

1. A charge pump circuit for driving a power MOS transistor bridge where the bridge is supplied with a bridge power supply voltage, said charge pump circuit comprising:
    a tank capacitance for storing a charge corresponding to the driving voltage for the power MOS transistor bridge;
    an inductance responsive to said bridge power supply voltage for delivering a charge current to said capacitance;
    a control transistor coupled to said inductance and tank capacitance so that, in a first condition of the control transistor, the inductance delivers the charge current to the capacitance and, in a second condition thereof, the delivery of the charge current is interrupted;
    an oscillator coupled to said control transistor having a preset frequency for periodically switching the control transistor between its first and second conditions; and
    means including a comparator responsive to the driving voltage of the tank capacitance and the bridge power supply voltage for (a) inhibiting the periodic switching of the control transistor by the oscillator in response to the difference between the driving voltage and the bridge power supply voltage exceeding a preset maximum value and (b) restarting the said periodic switching operation in response to said difference falling below a preset minimum value.

2. Charge pump circuit according to claim 1 including a further comparator responsive to the magnitude of the charge current delivered by the inductance and a preset threshold for controlling the periodic switching of the control transistor by the oscillator to thus prevent excessive build up of said charging current in the inductance in response to the charging current exceeding said preset threshold.

3. Charge pump circuit according to claim 1, characterized in that said control transistor is of the bipolar type.

4. Charge pump circuit according to claim 1, characterized in that said control transistor is shunt connected between said inductance and earth with respect to said capacitance.

5. Charge pump circuit according to claim 1, characterized in that said comparator is of the hysteresis type.

* * * * *